(12) United States Patent
Muraoka

(10) Patent No.: US 9,520,644 B2
(45) Date of Patent: Dec. 13, 2016

(54) ANTENNA AND COMMUNICATION APPARATUS AS WELL AS MANUFACTURING METHOD FOR ANTENNA

(75) Inventor: Kouji Muraoka, Fukui (JP)

(73) Assignee: SHUHOU CO., LTD., Fukui (JP)

( * ) Notice: Subject to any disclaimer, the term of this patent is extended or adjusted under 35 U.S.C. 154(b) by 534 days.

(21) Appl. No.: 14/117,476

(22) PCT Filed: Aug. 4, 2011

(86) PCT No.: PCT/JP2011/004418
§ 371 (c)(1),
(2), (4) Date: Jan. 22, 2014

(87) PCT Pub. No.: WO2012/157030
PCT Pub. Date: Nov. 22, 2012

(65) Prior Publication Data
US 2014/0333484 A1   Nov. 13, 2014

(30) Foreign Application Priority Data

May 13, 2011   (JP) .................................. 2011-108369

(51) Int. Cl.
| | | |
|---|---|---|
| *H01Q 1/38* | (2006.01) | |
| *H05K 3/18* | (2006.01) | |
| *H01Q 1/27* | (2006.01) | |
| *H01Q 1/36* | (2006.01) | |
| *H05K 3/24* | (2006.01) | |
| *H01Q 1/24* | (2006.01) | |

(52) U.S. Cl.
CPC ................ *H01Q 1/38* (2013.01); *H01Q 1/243* (2013.01); *H01Q 1/27* (2013.01); *H01Q 1/36* (2013.01); *H01Q 1/364* (2013.01); *H05K 3/18* (2013.01); *H05K 3/182* (2013.01); *H05K 3/245* (2013.01); *H05K 3/246* (2013.01); *H05K 2201/0266* (2013.01); *H05K 2203/0709* (2013.01)

(58) Field of Classification Search
CPC .............. H01Q 1/38; H01Q 1/36; H01Q 1/27; H05K 3/18; H05K 3/245
See application file for complete search history.

(56) References Cited

U.S. PATENT DOCUMENTS

| 2004/0025732 A1 * | 2/2004 | Tuck ........................ H01J 9/025 101/483 |
| 2005/0200539 A1 | 9/2005 | Forster et al. |
| 2007/0144913 A1 | 6/2007 | Muraoka |
| 2008/0030424 A1 * | 2/2008 | Muraoka .................. H01Q 1/38 343/897 |
| 2012/0268906 A1 | 10/2012 | Kim et al. |

FOREIGN PATENT DOCUMENTS

| CN | 1860258 A | 11/2006 |
| CN | 101964446 A | 2/2011 |
| DE | 10 2008 063 030 A1 | 6/2010 |
| GB | 2 4127 127 A | 2/2006 |
| JP | 2002-197435 A | 7/2002 |
| JP | 2007-324641 A | 12/2007 |
| JP | 2008-283587 A | 11/2008 |
| JP | 2010-226513 A | 10/2010 |
| KR | 10-2007-0001182 A | 1/2007 |
| TW | 504864 B | 10/2002 |
| WO | 2008/015167 A1 | 2/2008 |

OTHER PUBLICATIONS

Office Action dated Apr. 3, 2015 for Chinese Patent Application No. 201180070847.1 with English translation.
Office Action dated Sep. 12, 2014 for Korean Patent Application No. 10-2013-7028028 with English translation.
espacenet English abstract of KR 10-2007-0001182 A.
Office Action dated Sep. 3, 2014 for Chinese Patent Application No. 2201180070847.1 with English translation.
espacenet English abstract of CN 101964446 A.
Extended European Search Report dated Sep. 18, 2014 for Application No. EP 11865870.7-1812.
espacenet English abstract of DE 10 2008 063 030 A1.
Office Action dated Dec. 22, 2014 for Taiwan Patent Application No. 101116807 with English translation.
espacenet English abstract of TW 504864 B.

* cited by examiner

*Primary Examiner* — Betelhem Shewareged
(74) *Attorney, Agent, or Firm* — Ladas & Parry LLP

(57) ABSTRACT

This antenna (10) has an underlying print layer (2) which is upon the surface of a material (1) to be printed in a predetermined antenna pattern, and an electro-less plating layer (3) applied to the surface of the underlying print layer (2). The underlying print layer (2) is formed from an ink (2a) and a metallic powder (2b). A portion of the particles of the metallic powder (2b) are entrained within the ink layer in which the ink (2a) has been printed in a substantially uniform thickness. Some particles which are of large particle size project from the ink layer, and a portion of the ink (2a) covering the projecting portions is removed.

11 Claims, 5 Drawing Sheets

(a) <INTEGRAL PARTICLE SIZE DISTRIBUTION GRAPH>

(b) <DIFFERENTIAL PARTICLE SIZE DISTRIBUTION GRAPH>
(DISTRIBUTIONS RELATIVE TO MAXIMUM DISTRIBUTION AS 100%)

ANTENNA AND COMMUNICATION APPARATUS AS WELL AS MANUFACTURING METHOD FOR ANTENNA

RELATED APPLICATION INFORMATION

This application is a 371 of International Application PCT/JP2011/004418 filed 4 Aug. 2011 entitled "Antenna And Communication Apparatus As Well As Manufacturing Method For Antenna", which was published on 22 Nov. 2012, with International Publication Number WO 2012/157030 A1, and which claims priority from Japanese Patent Application 2011-108369 filed 13 May 2011, the content of which is incorporated herein by reference.

TECHNICAL FIELD

The present invention relates to antennas, communication devices, and antenna manufacturing methods. In particular, the invention relates to an antenna disposed on a face material, a communication device having a face material on which the antenna is disposed, and a method for manufacturing the antennas.

BACKGROUND ART

In various communication devices including mobile phones and personal computers capable of wireless transmission and reception, there have hitherto been demands for antennas which can operate at a wide range of frequencies and save space. In order to meet such demands, the inventor of the present invention has disclosed an invention directed to printing of antennas to housings of communication devices (see, for example, Patent Literature 1).

CITATION LIST

Patent Literature

Patent Literature 1: Japanese Unexamined Patent Application Publication No. 2008-283587 (pp. 5-6, FIG. 4)

SUMMARY OF INVENTION

Technical Problem

The invention disclosed in Patent Literature 1 has met the demands with a technique in which a workpiece (for example, an exterior face of a mobile phone or the like) is printed with a conductive ink to form an antenna pattern, and the formed pattern is coated with an electroless plating and an electrolytic plating, and further the plated pattern is covered with a decorative coating.

However, the technique involves the need of providing contacts for energization on the workpieces. Thus, the production of contacts as well as preparing jigs for ensuring energization need extra efforts and result in a decrease in working efficiency, making it difficult to save production costs. Further, because the areas for the contacts formed for energization are not plated, there is a risk that corrosion (oxidation) occurs from these unplated portions. Thus, there have been demands on further saving of production costs as well as on the stabilization of quality for a long term.

Further, conductive inks contain large amounts of metal particles. Thus, the adhesion between a conductive ink layer and an electroless plating layer is not always sufficiently strong. Thus, there have been some concerns about reliability of the design of appearance and of the durability during long use. Thus, higher adhesion for improving reliability has been demanded.

In order to meet these demands, the invention provides antennas which are obtainable by simple work but have improved reliability of quality, as well as communication devices having the antennas, and methods for manufacturing the antennas.

Solution to Problem (1) An antenna according to the present invention includes a base print layer printed in a predetermined antenna pattern on a workpiece, and an electroless plating layer disposed on the surface of the base print layer, the base print layer being formed of an ink containing a plurality of metal particles having a predetermined particle diameter distribution, some of particles of the metal particles are buried in an ink layer forming the base print layer, some of the particles of the metal particles are protrudent from the ink layer forming the base print layer, and part of the ink covering the protrudent portions having been removed.

(2) In (1), the metal particles may be contained in the ink with a proportion by volume of 30 to 70%.

(3) In (1) or (2), the electroless plating layer may be formed of Cu, and an electroless Ni plating layer may be disposed on a surface of the electroless Cu plating layer.

(4) in (3), an electroless Au plating layer may be disposed on a surface of the electroless Ni plating layer.

(5) in any of (1) to (4), the metal particles may be any of Cu, Ni, Fe, Mg, Pd, Ag, Au and C, or may be an alloy of any of Cu, Ni, Fe, Mg, Pd, Ag and Au, the particle diameters of approximately 95% of the metal particles may be distributed in the range from 0.04 to 50 μm, and the particle diameters of approximately 40% of the metal particles may be distributed in the range from 5 to 30 μm.

(6) A communication device according to the present invention includes the antenna of any of (1) to (5).

(7) An antenna manufacturing method according to the present invention includes a printing step of forming a base print layer in a predetermined antenna pattern on a surface of a workpiece with an ink containing a plurality of metal particles having a predetermined particle diameter distribution;

an ink removing step of removing, from those of the metal particles being protrudent from an ink layer forming the base print layer, part of the ink covering the portions protrudent from the ink layer; and an electroless plating step of forming an electroless plating layer on a surface of the base print layer.

Advantageous Effects of Invention (i) In the antennas of the invention, an electroless plating layer is disposed on a surface of a base print layer formed of an ink containing metal particles. Thus, the invention eliminates the needs of forming contacts for energization, or preparing jigs for ensuring energization, thereby allowing for the work to be completed simply and quickly. Consequently, production costs can be saved. Further, the absence of contacts eliminates partially unplated areas and thus eliminates the risk of the occurrence of local corrosion (oxidation).

Furthermore, some of the particles of the metal particles are buried in the ink layer (some of small particles are exposed on the surface of the ink layer), some of the particles of the metal particles are protrudent from the ink layer, and the protrudent portions are partially cleared of the ink (some of large particles are not cleared of the ink at their protrudent portions). With this configuration, the ink layer achieves good adhesion with respect to the electroless plating layer, thus improving reliability of the design of appearance and of the durability during long use.

The term "insulating", when used for the "ink" or the "base print layer", does not mean that the material does not conduct electricity at all (the electrical resistance is substantially infinite), but indicates that the material has higher electrical resistance compared to that of the metal particles. That is, this term may be otherwise read as hardly conductive or being high in electrical resistance.

(ii) The communication devices of the invention have the antennas, and therefore the costs of manufacturing thereof can be saved and reliability of the design of appearance and of the durability during long use can be improved.

DESCRIPTION OF EMBODIMENTS

Embodiment 1

Antennas

Figure 1:
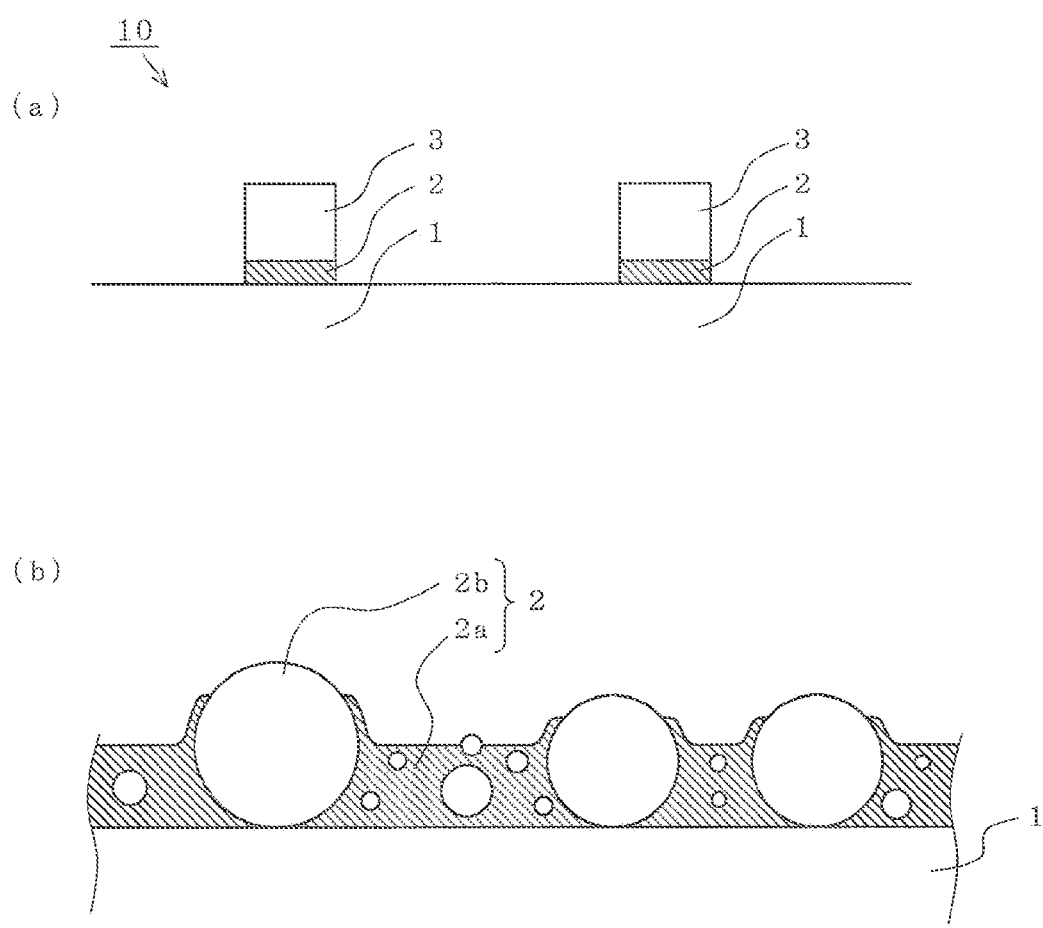
FIG. 1 is a sectional view schematically illustrating an antenna and an enlarged sectional view schematically illustrating a portion (base print layer) of the antenna according to Embodiment 1 of the invention.
Figure 2:
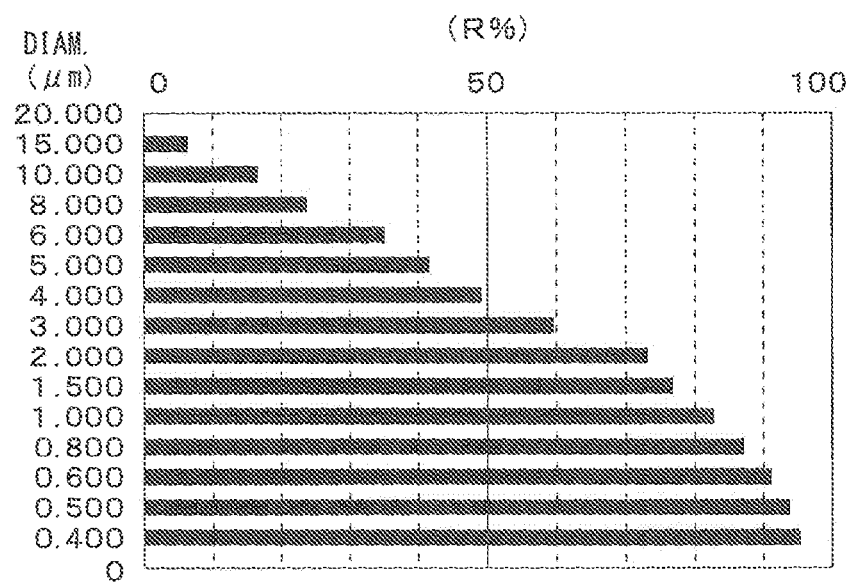
FIG. 2 is distribution graphs illustrating examples of an integral particle size distribution (sedimentation method) and a differential particle size distribution (sedimentation method) of metal particles.
Figure 2:
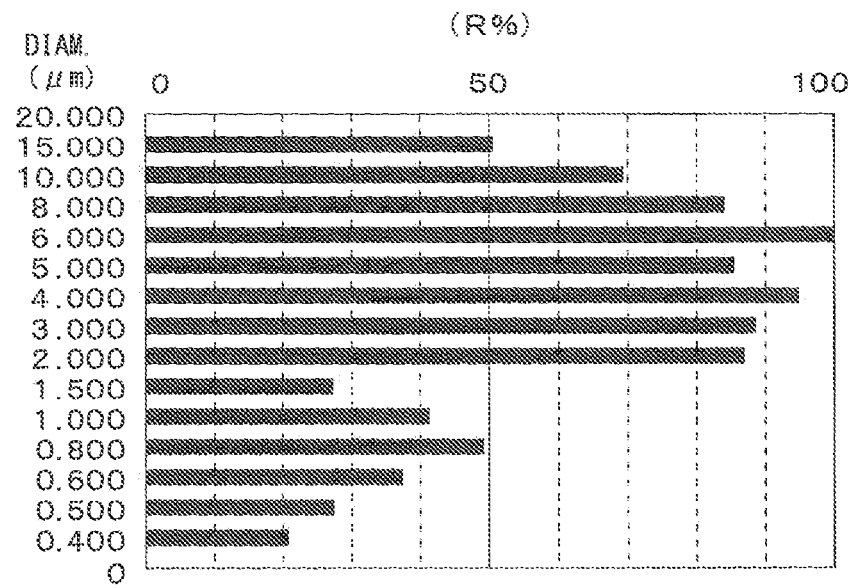

FIG. 1 illustrates an antenna according to Embodiment 1 of the invention. FIG. 1(a) is a schematic sectional view, and FIG. 1(b) is an enlarged sectional view schematically illustrating a portion (base print layer). FIG. 2(a) is a distribution graph illustrating an example of an integral particle size distribution (sedimentation method) of metal particles, and FIG. 2(b) is a distribution graph illustrating an example of a differential particle size distribution (sedimentation method) of metal particles.

In FIG. 1(a), an antenna 10 has a base print layer 2 printed in a predetermined antenna pattern on a surface of a workpiece 1, and an electroless plating layer 3 disposed on the surface of the base print layer 2.

The antenna pattern is variable in accordance with the desired performance of the antenna as well as the shape (such as the size) of the workpiece. The linewidth of the antenna pattern (the same as the linewidth of the base print layer 2 and the linewidth of the electroless plating layer 3) is not limited.

The term "surface" is not limited literally to the meaning of front surface, but includes back surface, front side, backside, and any corners or edges connecting these faces.

In FIG. 1(b), the base print layer 2 is formed of an ink 2a and metal particles 2b. The ink 2a has been printed with a substantially uniform thickness (for example, about 7 μm) to form an ink layer (marked with diagonal lines), in which some of the metal particles 2b (particles having a smaller particle diameter than the thickness of the ink layer) are buried. Even when the particles have a smaller particle diameter than the thickness of the ink layer, some of such particles are partially exposed on the surface of the ink layer (see FIG. 1(b)).

Further, some of the metal particles 2b (mainly particles having a particle diameter larger than the thickness of the ink layer) are protrudent from the ink layer, and the protrudent portions are partially cleared of the ink 2a. Some protrudent portions of the metal particles 2b are not cleared of the ink (not shown in the figure).

For example, referring to FIGS. 2(a) and 2(b), the particle diameters of approximately 95% of the metal particles 2b are distributed in the range from 0.04 to 50 μm, and the particle diameters of approximately 40% of the metal particles are distributed in the range from 5 to 30 μm. The metal particles 2b include coarse particles having a particle diameter of 20 μm or more, as well as fine particles having a particle diameter of 0.4 μm or less.

The metal particles 2b may be contained with a proportion by volume of 30 to 70%, and preferably 40 to 60% relative to the ink 2a. Accordingly, the base print layer 2 has greater electrical resistance than the electrical resistance of the metal particles 2b and thus may be deemed as insulating.

Further, because the ink 2a covering the portions of larger particles of the metal particles 2a that protrude from the ink layer has been partially removed as described above, electroless plating takes place slowly and good adhesion is obtained between the base print layer 2 and the electroless plating layer 3. Consequently, reliability of the design of appearance and of the durability during long use may be improved.

The electroless plating layer 3 is formed of Cu or Ni with a thickness of 7 to 15 μm, and has a linewidth substantially the same as the linewidth of the base print layer 2, thus achieving functions as an antenna.

The material (metal) forming the electroless plating layer 3 is not limited to Cu or Ni, and may be any of appropriate materials.

An electroless Au (gold) plating layer may be additionally formed on the surface of the electroless plating layer 3.

The material (metal) of the metal particles 2b is not limited, and may be any of Cu, Ni, Fe, Mg, Pd, Ag, Au, and C, or may be an alloy of any of Cu, Ni, Fe, Mg, Pd, Ag, and Au. The particle size (particle diameter) distributions are not limited to the exemplary distributions illustrated in FIG. 2.

Embodiment 2

Antennas

Figure 3:
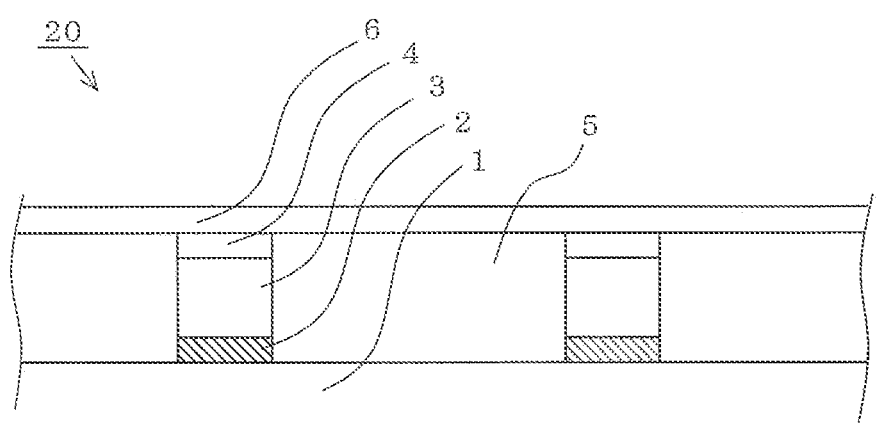
FIG. 3 is a sectional view schematically illustrating an antenna according to Embodiment 2 of the invention.

FIG. 3 is a sectional view schematically illustrating an antenna according to Embodiment 2 of the invention. Members that are identical with or correspond to the members in Embodiment 1 are assigned with the same reference signs and part of the explanations of such members may be omitted.

In FIG. 3, an antenna 20 has a base print layer 2 printed in a predetermined antenna pattern on a surface of a workpiece 1, an electroless plating layer 3 disposed on the surface of the base print layer 2, a covering face 4 covering the surface of the electroless plating layer 3, a supplementary coating layer 5 covering the surface of the workpiece 1 except the region covered with the base print layer 2, and a decorative coating layer 6 covering the covering face 4 and the supplementary coating layer 5.

The covering face 4 is a film that is formed from an ink containing 5 to 30% (preferably 10%) of silicone oil. This face is dry, and exhibits so-called repellency and "repels" the supplementary coating layer 5.

The supplementary coating layer 5 is repelled by the dry covering face 4 and is prevented from attaching to the surface of the covering face 4. Therefore, the supplementary coating layer 5 is formed by being printed or applied so as to fill the workpiece 1 except the antenna pattern (the covering face 4). The supplementary coating layer 5 is formed such that the surface thereof is of the same level as the surface of the covering face 4 to give a uniform surface (without unevenness) on which the decorative coating layer 6 is to be disposed; in view of this, the material thereof is not limited as long as the supplementary coating layer 5 exhibits good adhesion with respect to the workpiece surface 1 and the decorative coating layer 6.

The decorative coating layer 6 is a covering of a very thin coating agent on the covering face 4 and the supplementary coating layer 5. A single layer or a stack of layers is disposed in accordance with, for example, designing demands. Before the decorative coating layer 6 is disposed, the surface of the covering face 4 is activated by forming fine unevenness on the surface by chemical or physical means in order to give wettability to the surface of the covering face 4.

This configuration can render the antenna pattern (the same as the electroless plating layer 3) invisible. Thus, even when the antenna 20 is provided on an exterior surface of a device such as a communication device, the aesthetic appearance of the device such as a communication device is not deteriorated. Further, appropriate selection of the decorative coating layers 6 is possible to allow for an enhancement of design properties.

Embodiment 3

Communication Devices

Figure 4:
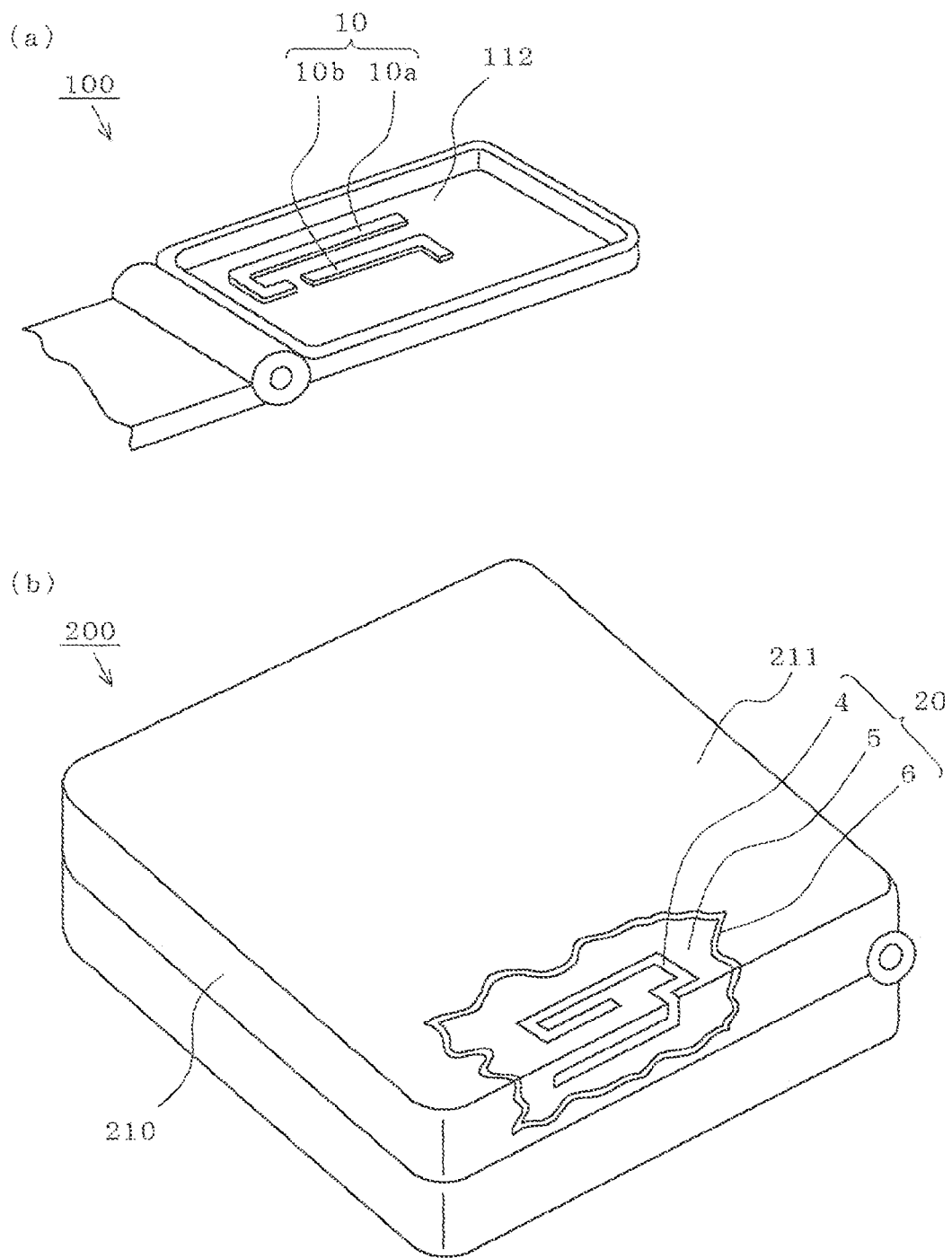
FIG. 4 is perspective views schematically illustrating a mobile phone and a personal computer for explaining communication devices according to Embodiment 3 of the invention.

FIG. 4 illustrates communication devices according to Embodiment 3 of the invention. FIG. 4(a) is a perspective view schematically illustrating a mobile phone, and FIG. 4(b) is a partially transparent perspective view schematically illustrating a personal computer (hereinafter, referred to as "computer").

In FIG. 4(a), a mobile phone 100 has antennas 10a, 10b provided on an inner face (or a back surface) 112 of a body case 110. The inner face 112 is to be covered with a member such as a liquid crystal display or a keyboard (not shown), and therefore the antennas 10a, 10b are not visible from outside.

The antenna 10a and the antenna 10b are the same as the antennas 10 described in Embodiment 1 and have the effects described hereinabove. Thus, the mobile phone 100 achieves improved reliability of durability during long use.

The antenna 10a and the antenna 10b are switched in accordance with sending and receiving frequencies. The mobile phone 100 is not limited to the configuration having the antennas 10a, 10b, and may have one of these antennas or a third antenna 10, or may have an antenna 20 on the exterior face of the body case 110.

In FIG. 4(b), a computer 200 has an antenna 20 provided on an exterior face (or a front surface) 211 of a lid 210. A decorative coating layer 6 of the antenna 20 covers not only the top of the antenna 20 but also the entirety of the exterior face 211.

This configuration renders the antenna pattern (the same as an electroless plating layer 3) invisible. Thus, design properties can be enhanced while ensuring the communication functions of the antenna 20 without deteriorations in the aesthetic appearance of the computer 200.

The computer 200 is not limited to the configuration having the antenna 20, and may have a plurality of the antennas 20 or may have an antenna 10 in an inner face (or a back surface) together with the antenna 20 or in place of the antenna 20.

Embodiment 4

Antenna Manufacturing Methods

Figure 5:
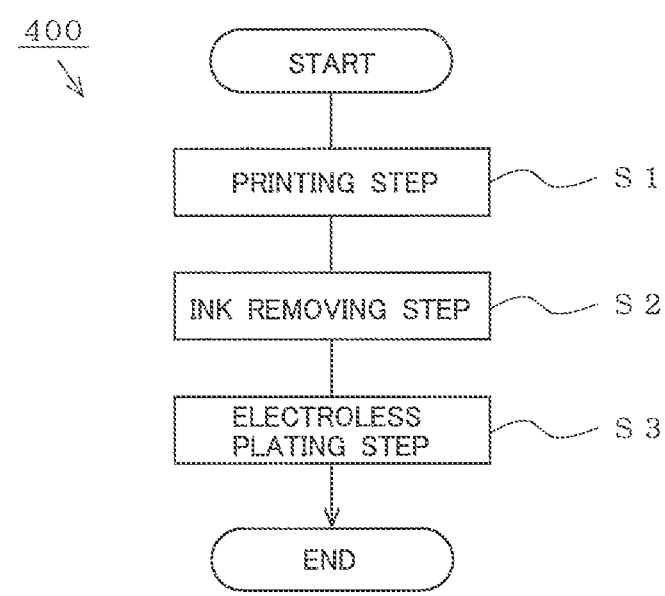
FIG. 5 is a flow chart illustrating an antenna manufacturing method according to Embodiment 4 of the invention.

FIG. 5 is a flow chart illustrating an antenna manufacturing method according to Embodiment 4 of the invention. Members or sections that are identical with or correspond to the members or sections in Embodiment 1 are assigned with the same reference signs and part of the explanations of such members or sections may be omitted.

In FIG. 5, an antenna manufacturing method 400 includes a printing step (S1) in which a base print layer 2 is formed in a predetermined antenna pattern on a surface of a workpiece 1 with an ink 2a containing a plurality of metal particles 2b having a predetermined particle diameter distribution;

an ink removing step (S2) in which, among the metal particles 2b, those metal particles 2b protrudent from an ink layer forming the base print layer 2 (marked with diagonal lines in FIG. 1(b)) are cleared of part of the ink 2a covering the portions protrudent from the ink layer; and an electroless plating step (S3) in which an electroless plating layer 3 is formed on the surface of the base print layer 2.

According to the antenna manufacturing method 400 having this configuration, the antennas 10 described in Embodiment 1 can be obtained through simple work with simple equipment (which does not require any energization devices and jigs or tools for holding contacts).

INDUSTRIAL APPLICABILITY

According to the present invention, the configurations (shapes, sizes) of antenna patterns are not limited. Thus, the antennas and the antenna manufacturing methods of the invention can be used widely as or to produce communication sections of various apparatuses that send or receive signals wirelessly at various frequencies. Further, the inventive devices can be used widely as various communication devices including computers and mobile phones.

REFERENCE SIGNS LIST 1 workpiece 2 base print layer 2a ink 2b metal particles 3 electroless plating layer 4 covering face 5 supplementary coating layer 6 decorative coating layer 10 antenna (Embodiment 1) 20 antenna (Embodiment 2) 100 mobile phone (Embodiment 3) 110 body case 112 inner face 200 computer (Embodiment 3) 210 lid 211 exterior face 400 antenna manufacturing method (Embodiment 4)

The invention claimed is:

1. An antenna comprising:
   a base print layer printed in a predetermined antenna pattern on a workpiece, the base print layer being formed of an ink containing a plurality of metal particles having a predetermined particle diameter distribution; and
   an electroless plating layer disposed on a surface of the base print layer, wherein some of the metal particles are buried in an ink layer forming the base print layer, some of the metal particles are protrudent from the ink layer forming the base print layer, and part of the ink covering portions of the protrudent metal particles has been removed.

2. The antenna of claim 1, wherein the metal particles are contained in the ink with a proportion by volume of 30 to 70%.

3. The antenna of claim 1, wherein the electroless plating layer is formed of Cu, and an electroless Ni plating layer is disposed on a surface of the electroless Cu plating layer.

4. The antenna of claim 3, wherein an electroless Au plating layer is disposed on a surface of the electroless Ni plating layer.

5. The antenna of claim 1, wherein,
   the metal particles are any of Cu, Ni, Fe, Mg, Pd, Ag, Au and C, or an alloy of any of Cu, Ni, Fe, Mg, Pd, Ag and Au, and
   particle diameters of approximately 95% of the metal particles are distributed in the range from 0.04 to 50 μm, and the particle diameters of approximately 40% of the metal particles are distributed in the range from 5 to 30 μm.

6. A communication device comprising the antenna of claim 1.

7. A method for manufacturing the antenna of claim 1 comprising:
   a printing step of forming the base print layer in a predetermined antenna pattern on a workpiece with the ink containing the plurality of metal particles having a predetermined particle diameter distribution;
   an ink removing step of removing, from those of the metal particles that are protrudent from ink layer forming the base print layer, part of the ink covering portions of the metal particles that are protrudent from the ink layer; and
   an electroless plating step of forming the electroless plating layer on a surface of the base print layer.

8. The antenna of claim 2, wherein the electroless plating layer is formed of Cu, and an electroless Ni plating layer is disposed on a surface of the electroless Cu plating layer.

9. The antenna of claim 5, wherein an electroless Au plating layer is disposed on a surface of the electroless Ni plating layer.

10. The antenna of claim 2, wherein,
    the metal particles are any of Cu, Ni, Fe, Mg, Pd, Ag, Au and C, or an alloy of any of Cu, Ni, Fe, Mg, Pd, Ag and Au, and
    particle diameters of approximately 95% of the metal particles are distributed in the range from 0.04 to 50 μm, and the particle diameters of approximately 40% of the metal particles are distributed in the range from 5 to 30 μm.

11. A communication device comprising the antenna of claim 2.

* * * * *